United States Patent
Hsu et al.

(10) Patent No.: US 8,866,174 B2
(45) Date of Patent: *Oct. 21, 2014

(54) LIGHT-EMITTING DEVICE

(71) Applicant: Epistar Corporation, Hsinchu (TW)

(72) Inventors: Tzu-Chieh Hsu, Hsinchu (TW); Ching-San Tao, Hsinchu (TW); Chen Ou, Hsinchu (TW); Min-Hsun Hsieh, Hsinchu (TW); Chao Hsing Chen, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/772,149

(22) Filed: Feb. 20, 2013

(65) Prior Publication Data

US 2013/0181245 A1 Jul. 18, 2013

Related U.S. Application Data

(63) Continuation of application No. 12/753,551, filed on Apr. 2, 2010, now Pat. No. 8,405,106, which is a continuation-in-part of application No. 11/581,439, filed on Oct. 17, 2006, now abandoned.

(30) Foreign Application Priority Data

Oct. 19, 2005 (TW) .............................. 94136605 A

(51) Int. Cl.
| | |
|---|---|
| *H01L 33/00* | (2010.01) |
| *H01L 33/20* | (2010.01) |
| *H01L 33/22* | (2010.01) |
| *H01L 33/42* | (2010.01) |
| *H01L 33/40* | (2010.01) |
| *H01L 33/38* | (2010.01) |
| *H01L 33/10* | (2010.01) |

(52) U.S. Cl.
CPC ............... *H01L 33/20* (2013.01); *H01L 33/405* (2013.01); *H01L 33/382* (2013.01); *H01L 33/22* (2013.01); *H01L 33/42* (2013.01); *H01L 33/10* (2013.01)

USPC .............. 257/98; 257/E33.068; 257/E33.074; 313/498; 313/506

(58) Field of Classification Search
USPC ............................ 257/98, E33.068, E33.074; 313/498–512
See application file for complete search history.

(56) References Cited

U.S. PATENT DOCUMENTS

| | | | |
|---|---|---|---|
| 5,414,281 | A | 5/1995 | Watabe et al. |
| 5,779,924 | A | 7/1998 | Krames et al. |

(Continued)

FOREIGN PATENT DOCUMENTS

| | | |
|---|---|---|
| TW | 461124 | 10/2001 |
| WO | WO2006038665 | 4/2006 |

*Primary Examiner* — Nimeshkumar Patel
*Assistant Examiner* — Jose M Diaz
(74) *Attorney, Agent, or Firm* — Muncy, Geissler, Olds & Lowe, P.C.

(57) ABSTRACT

A light-emitting device having a light-emitting stacked layer with a first conductivity type semiconductor layer is provided. A light-emitting layer is formed on the first conductivity type semiconductor layer. A second conductivity type semiconductor layer is formed on the light-emitting layer. The upper surface of the second conductivity type semiconductor layer is a textured surface. A planarization layer is formed on a first part of the second conductivity type semiconductor layer. A transparent conductive oxide layer is formed on the planarization layer and a second part of the second conductivity type semiconductor layer, including a first portion on the planarization layer and a second portion having a first plurality of cavities on the second conductivity type semiconductor layer. An electrode is formed on the first portion of the transparent conductive oxide layer, and a reflective metal layer is formed between the transparent conductive oxide layer and the electrode.

20 Claims, 13 Drawing Sheets

(56) References Cited

U.S. PATENT DOCUMENTS

| | | | |
|---|---|---|---|
| 6,078,064 A | 6/2000 | Ming-Jiunn et al. | |
| 6,277,665 B1 | 8/2001 | Ma et al. | |
| 6,329,748 B1 | 12/2001 | Kastalsky et al. | |
| 6,420,735 B2 | 7/2002 | Kim | |
| 6,441,403 B1 | 8/2002 | Chang et al. | |
| 6,495,862 B1 | 12/2002 | Okazaki et al. | |
| 6,504,180 B1 | 1/2003 | Heremans et al. | |
| 7,180,178 B2 | 2/2007 | Takashima et al. | |
| 7,244,957 B2 | 7/2007 | Nakajo et al. | |
| 7,291,865 B2 | 11/2007 | Kojima et al. | |
| 7,355,210 B2 | 4/2008 | Ou et al. | |
| 7,385,226 B2 | 6/2008 | Ou et al. | |
| 7,504,667 B2 | 3/2009 | Fujikura et al. | |
| 8,063,557 B2 * | 11/2011 | Hsieh et al. | 313/506 |
| 2002/0145148 A1 | 10/2002 | Okuyama et al. | |
| 2002/0179918 A1 | 12/2002 | Sung et al. | |
| 2003/0047745 A1 | 3/2003 | Suzuki et al. | |
| 2003/0119218 A1 | 6/2003 | Jang | |
| 2003/0218179 A1 | 11/2003 | Koide et al. | |
| 2004/0189184 A1 | 9/2004 | Yasuda | |
| 2005/0001227 A1 * | 1/2005 | Niki et al. | 257/98 |
| 2005/0104080 A1 | 5/2005 | Ichihara et al. | |
| 2005/0211995 A1 | 9/2005 | Ou et al. | |
| 2005/0224822 A1 | 10/2005 | Liu | |
| 2005/0285136 A1 | 12/2005 | Ou et al. | |
| 2005/0287687 A1 | 12/2005 | Liao et al. | |
| 2006/0071226 A1 | 4/2006 | Kojima et al. | |
| 2006/0076571 A1 | 4/2006 | Hsieh et al. | |
| 2008/0054278 A9 | 3/2008 | Ou et al. | |
| 2008/0135868 A1 | 6/2008 | Okagawa et al. | |
| 2009/0078951 A1 | 3/2009 | Miki et al. | |

* cited by examiner

LIGHT-EMITTING DEVICE

CROSS REFERENCE TO RELATED APPLICATIONS

This application is a Continuation of application Ser. No. 12/753,551, filed on Apr. 2, 2010, which issued as U.S. Pat. No. 8,405,106 on Mar. 26, 2013, which is a Continuation-in-Part of application Ser. No. 11/581,439, filed on Oct. 17, 2006, now abandoned, for which priority is claimed under 35 U.S.C. §120; and this application claims priority of Application No. 094136605, filed in Taiwan, R.O.C. on Oct. 19, 2005 under 35 U.S.C. §119, the entire contents of all of which are hereby incorporated by reference.

BACKGROUND

1. Technical Field

This application relates to a light-emitting diode device, and more particularly to a high light extraction light-emitting diode device.

2. Description of the Related Art

Light-emitting diode (LED) devices are widely used in different fields such as displays, traffic lights, data storage apparatus, communication apparatus, lighting apparatus, and medical apparatus. One important task for engineers is to increase the brightness of the LED devices.

In a known LED device, the semiconductor layer of the LED device having a textured surface can have higher light extraction efficiency. However, the textured surface can lower lateral current conduction and current spreading so the forward voltage is higher.

SUMMARY

A light-emitting device including: a light-emitting stacked layer having first conductivity type semiconductor layer, a light-emitting layer formed on the first conductivity type semiconductor layer, and a second conductivity type semiconductor layer formed on the light-emitting layer, wherein the upper surface of the second conductivity type semiconductor layer is a textured surface; a first planarization layer formed on a first part of the upper surface of the second conductivity type semiconductor layer; a first transparent conductive oxide layer formed on the first planarization layer and a second part of the second conductivity type semiconductor layer, including a first portion in contact with the first planarization layer and a second portion having a first plurality of cavities in contact with the second conductivity type semiconductor layer; and a first electrode formed on the first portion of the first transparent conductive oxide layer.

BRIEF DESCRIPTION OF THE DRAWINGS

The accompanying drawings are included to provide easy understanding of the application, and are incorporated herein and constitute a part of this specification. The drawings illustrate embodiments of the application and, together with the description, serve to illustrate the principles of the application.

DETAILED DESCRIPTION OF THE PREFERRED EMBODIMENTS

Figure 1A:
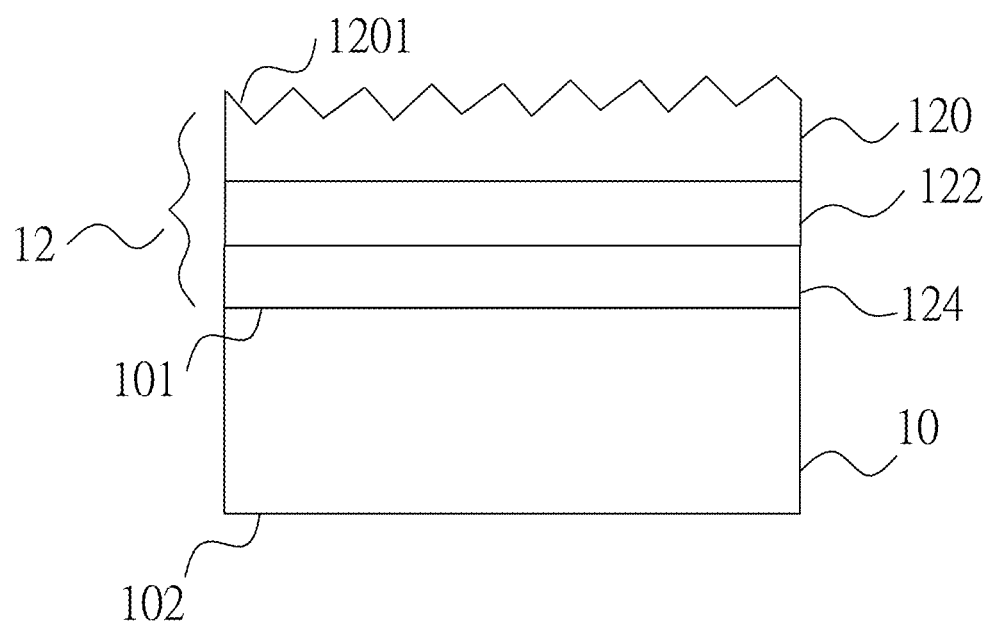
FIG. 1A-FIG. 1F illustrate a process flow of a method of fabricating a light emitting device in accordance with a first embodiment of the present application.

Reference is made in detail to the preferred embodiments of the present application, examples of which are illustrated in the accompanying drawings. Wherever possible, the same reference numbers are used in the drawings and the description to refer to the same or like parts.

The present disclosure describes a light emitting device and a method of fabricating the light emitting device. In order to have a thorough understanding of the present disclosure, please refer to the following description and the illustrations of FIG. 1A to FIG. 7.

FIGS. 1A to 1F illustrate a process flow of the method of fabricating a light emitting device in accordance with a first embodiment of the present application. Referring to FIG. 1A, a light-emitting device comprises a conductive substrate 10; a light emitting stack 12 including a first conductivity type semiconductor layer 124, a light-emitting layer 122 and a second conductivity type semiconductor layer 120 sequentially formed on the first surface 101 of the conductive substrate 10 wherein the upper surface 1201 of the second conductivity type semiconductor layer 120 has a textured surface formed by an epitaxy method, an etching method, or the combination thereof. The material of the light emitting stack 12 contains one or more elements selected from the group consisting of Ga, Al, In, As, P, N and Si, such as aluminum gallium indium phosphide (AlGaInP) series material, aluminum gallium indium nitride (AlGaInN) series material and so on. The light-emitting layer 122 can he a single heterostructure (SH), a double heterostructure (DH), a double-side double heterostructure (DDH), or a multi-quantum well (MWQ). Besides, the wavelength of the emitting light can also be adjusted by changing the number of the pairs of the quantum well.

Figure 1B:
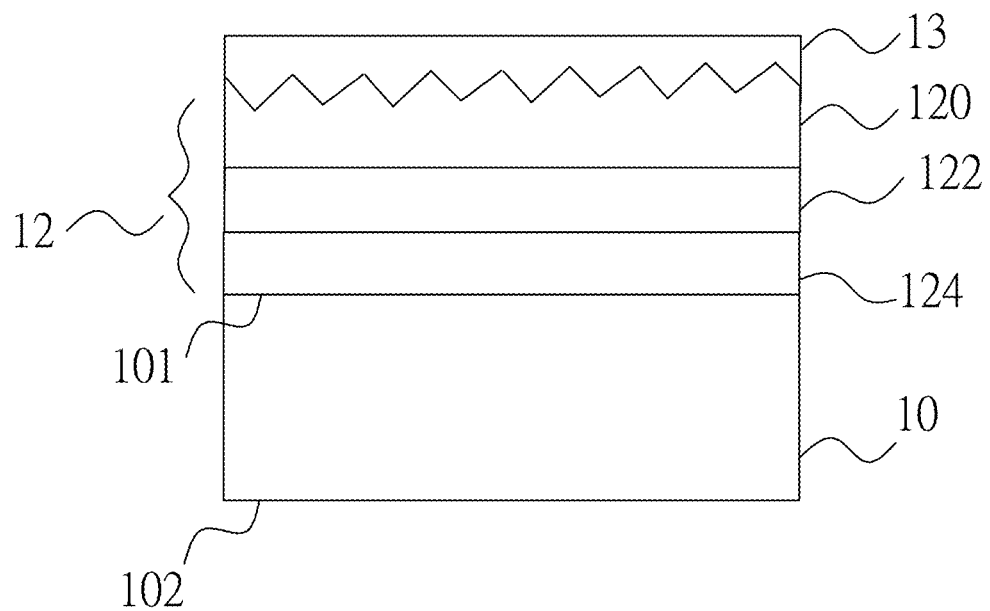

Referring to FIG. 1B, a first planarization layer 13 is formed to cover and fill the textured spaces of the upper surface 1201 of the second conductivity type semiconductor layer 120. The first planarization layer 13 can be formed by spin coating method such as spin-on glass (SOG) or benzocyclobutene (BCB). In one embodiment of this application, the SOG can be a dielectric material mixture of $SiO_2$ and dopants (either boron or phosphorous) that is suspended in a solvent solution. The SOG can also be polymers such as HSQ (Hydrogen silesquioxane) or MSQ (Methylsequioxane).

Figure 1C:
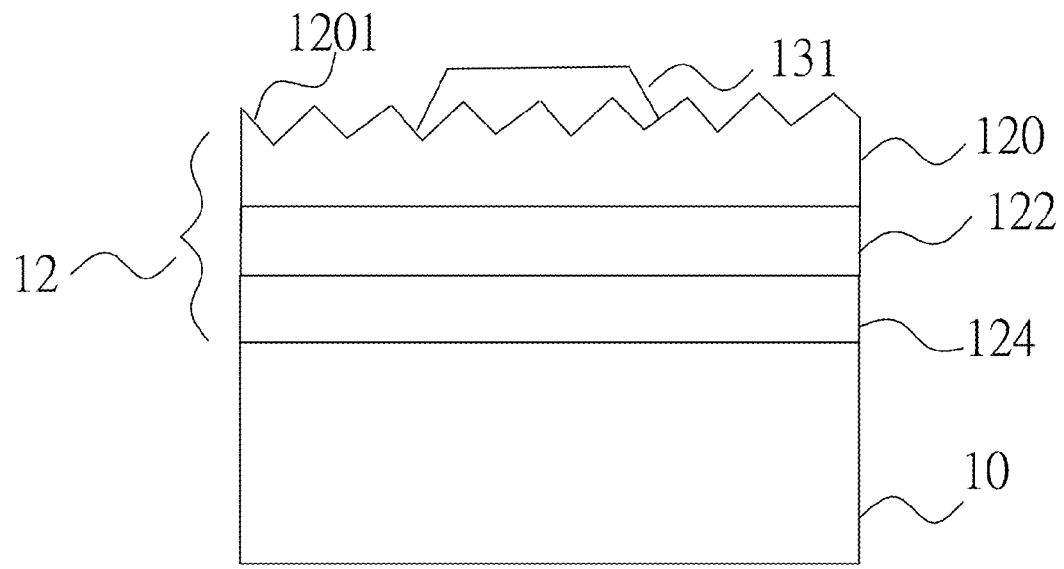

Referring to FIG. 1C, the first planarization layer 13 is patterned and solidified to form a second planarization layer 131 by etching or lithography method wherein part of the upper surface 1201 of the second conductivity type semiconductor layer 120 is exposed and not covered by the second planarization layer 131. The position of the second planarization layer 131 is not specified and can be formed in the middle or the edge of the second conductivity type semiconductor layer 120.

Figure 1D:
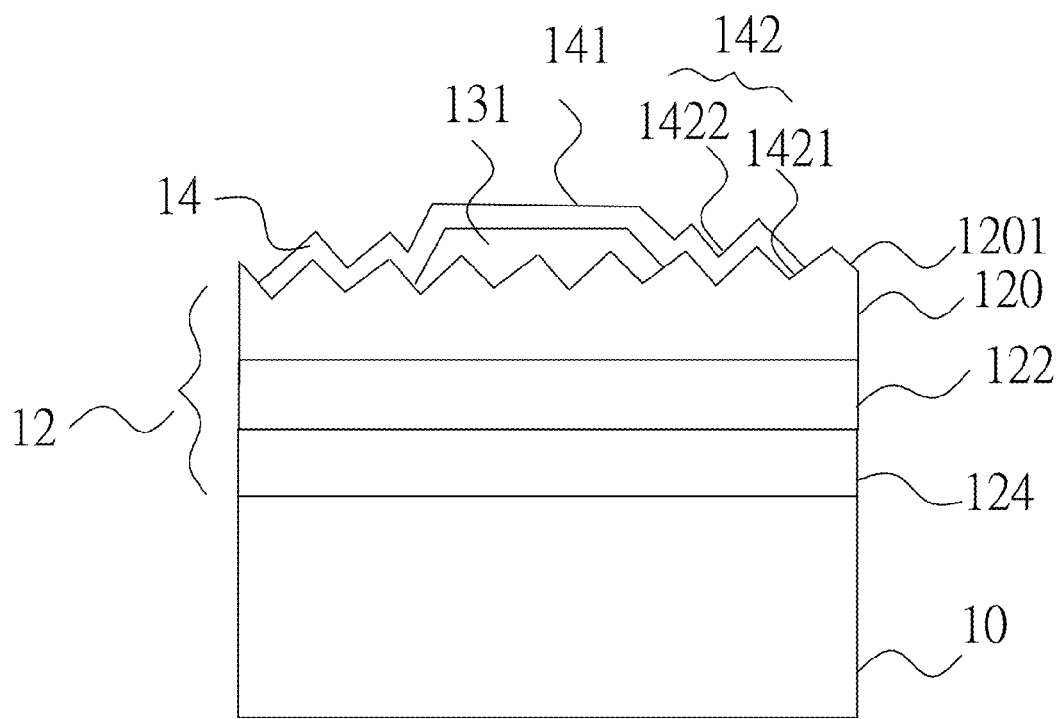

Referring to FIG. 1D, a first transparent conductive oxide layer 14 is formed to cover the entire second planarization layer 131 and part of the upper surface second conductivity type semiconductor layer 1201. The first transparent conductive oxide layer 14 includes a first portion 141 and a second portion 142, wherein the first portion 141 is formed in contact with the entire second planarization layer 131 which is substantially flat, and the second portion 142 is formed on the upper surface of the second conductivity type semiconductor layer 1201 having a first plurality of cavities 1421 in contact with the upper surface of the second conductivity type semiconductor layer 1201 and a second plurality of cavities 1422 formed in the upper surface of the second portion 142 which is opposite to the first plurality of cavities 1421. The first plurality of cavities 1421 are shaped into cones or pyramids (as shown in FIGS. 1G-1H) and formed by an epitaxy method, an etching method, or the combination thereof. The second plurality of cavities 1422 are shaped into a cone or a pyramid by an etching process and extended downwards to the first plurality of cavities 1421 of the first transparent conductive layer 14, wherein the direction of the extension is preferably perpendicular to the top surface of the conductive substrate 10.

Figure 1E:
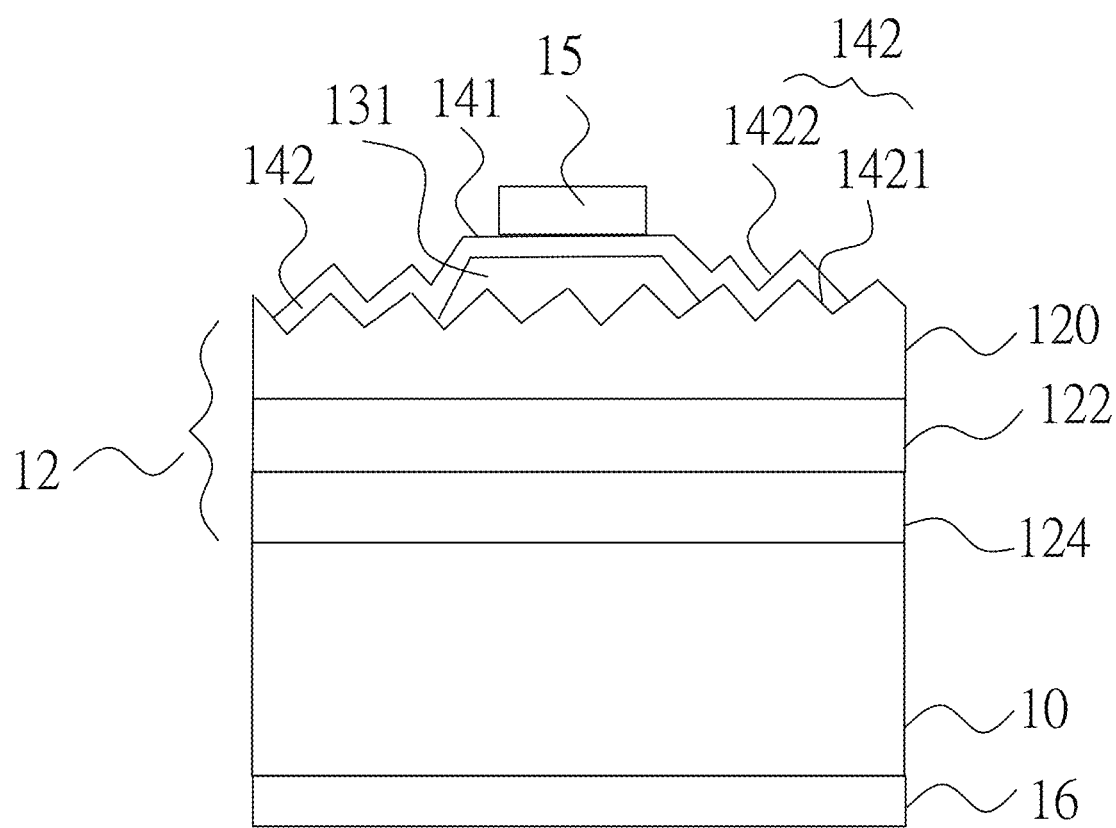

Referring to FIG. 1E, a first electrode 15 is formed on the first portion 141 of the first transparent conductive oxide layer 14; and a second electrode 16 is formed on the second surface 102 of the conductive substrate 10. The material of the electrode structure mentioned above can be metal material such as Cr, Ti, Ni, Pt, Cu, Au, Al, or Ag.

Figure 1F:
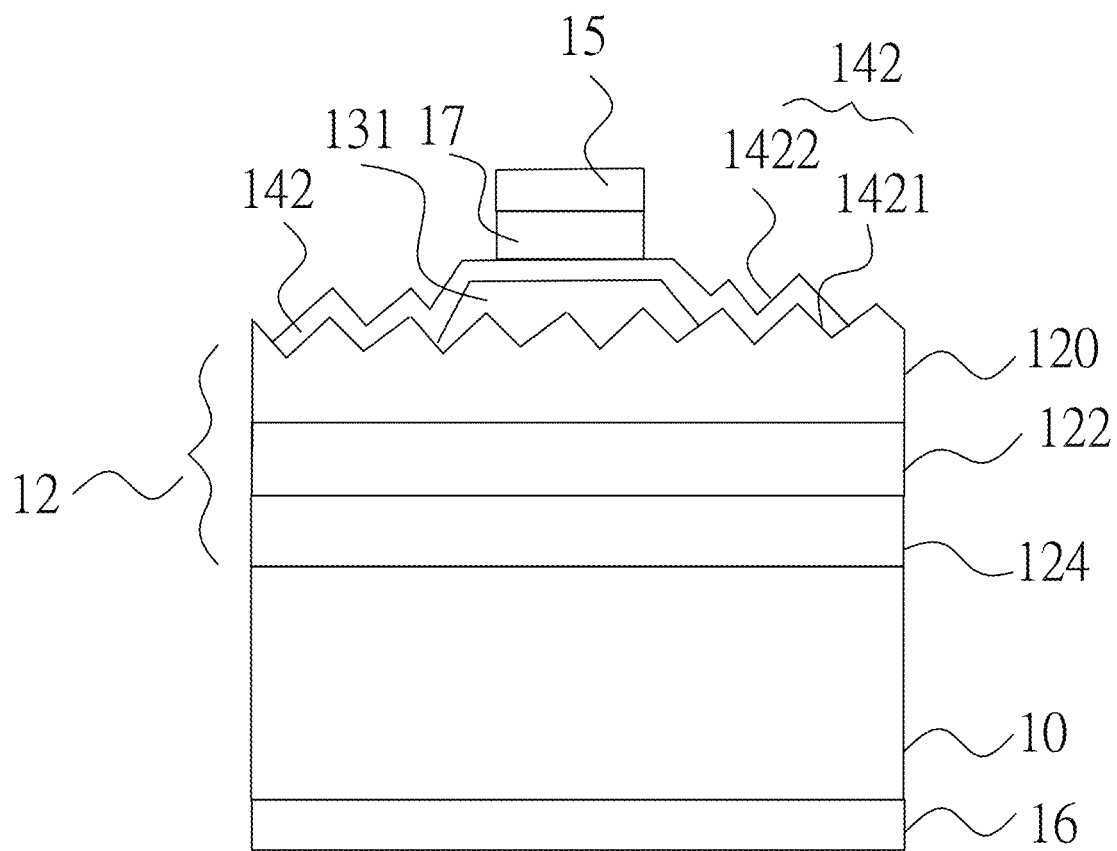
Figure 1G:
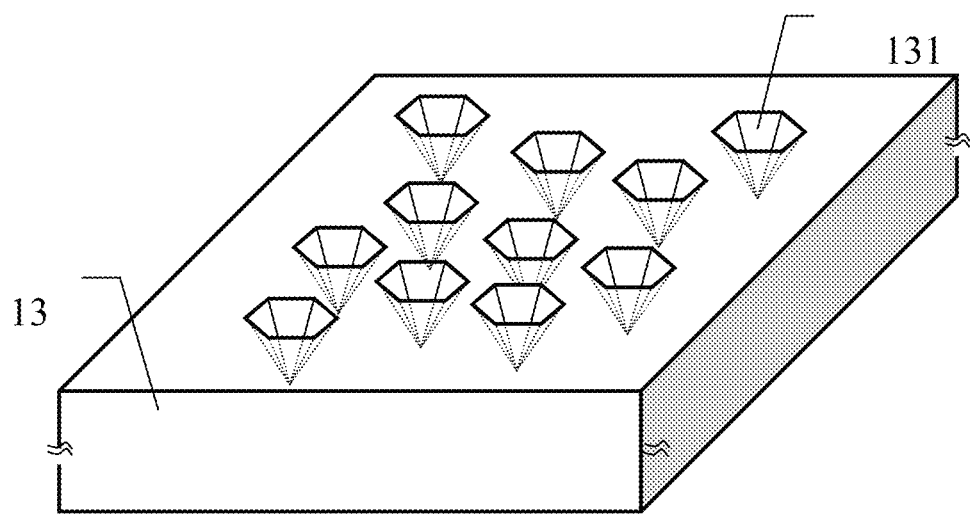
FIG. 1G is a top view of a second semiconductor layer in accordance with a first embodiment of the present application.
Figure 1H:
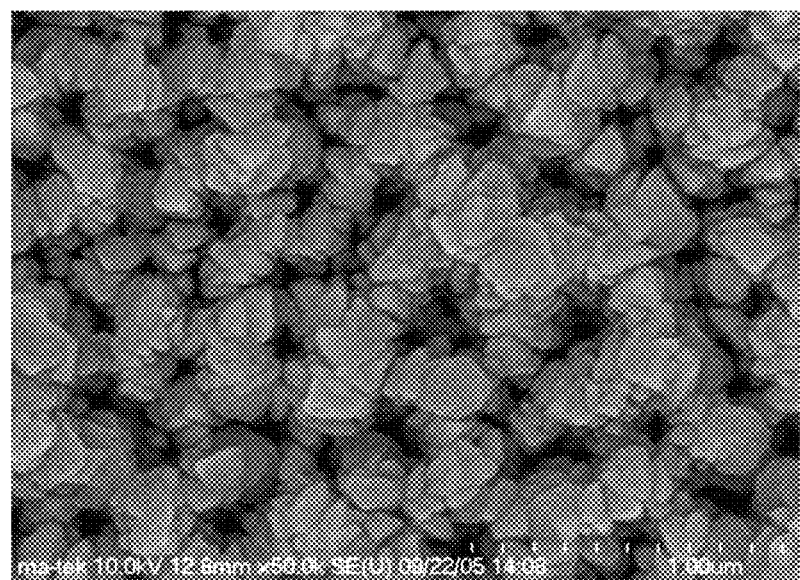
FIG. 1H is an SEM diagram showing a surface morphology of an ITO layer in accordance with a first embodiment of the present application.

Referring to FIG. 1F, in another embodiment of this application, a first reflective metal layer 17 can be formed on the first portion 141 of the first transparent conductive oxide layer 14; a first electrode 15 can be formed on the first reflective metal layer 17 to improve the light-emitting efficiency.

In accordance with the first embodiment of the present application, by forming the second planarization layer 131 the part of the transparent conductive oxide layer 14, the first electrode 15 and the first reflective metal layer 17 can be formed on a substantially flat surface, and the impedance and the forward voltage can be decreased and the lateral current conduction, current spreading and efficiency can be increased.

Besides, the first plurality of cavities 1421 are extended downwards from the surface of the second semiconductor layer 120 and make the upper surface of the second portion 142 of the first transparent conductive oxide layer 14 conformally formed on the second semiconductor layer 120 and have the second plurality of cavities 1422. The adhesion strength between the first reflective metal layer 17 and the first transparent conductive oxide layer 14 has been improved by the first plurality of cavities 1421. The result of a peeling test for the device made in accordance with the first embodiment and the conventional LED device without cavities on the surface of the first transparent oxide layer shows that all the devices in accordance with the first embodiment passed the peeling test, but more than 80% of the conventional LED devices failed in the peeling test. By the combination of the flat and textured first transparent oxide layer, the lower efficiency and peeling issues are solved.

Figure 2A:
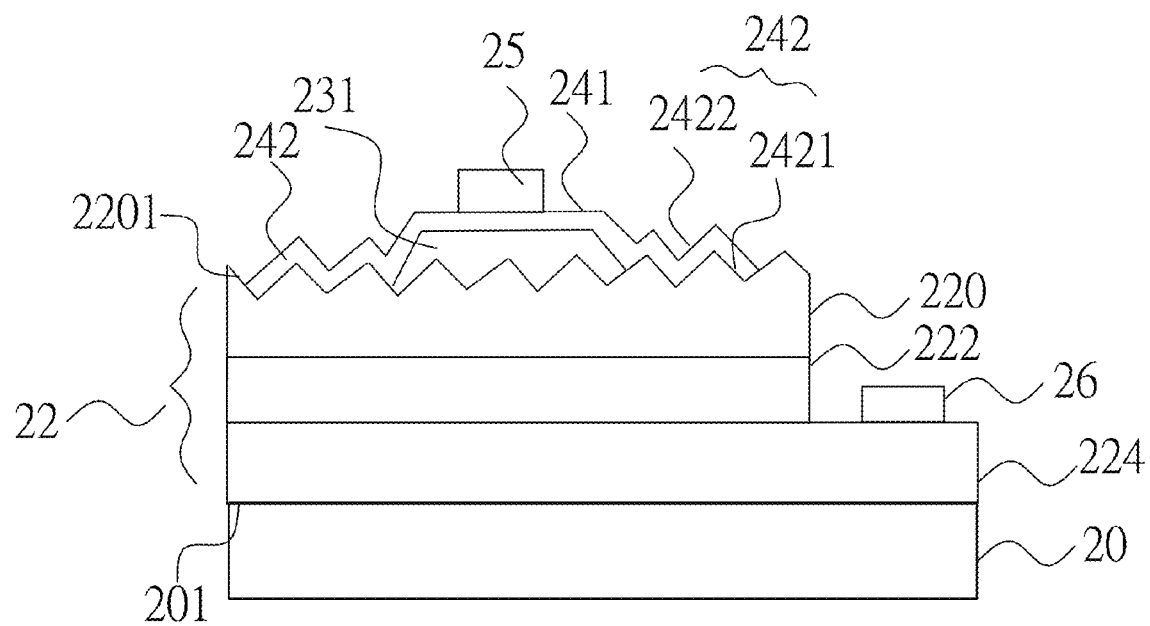
FIGS. 2A-2D are cross-sectional views of a light-emitting device in accordance with a horizontal type embodiment of the present application.

FIGS. 2A-2D are cross-sectional views of a light-emitting device in accordance with a horizontal type embodiment of the present application. Referring to FIG. 2A, a light-emitting device comprises a substrate 20; a light emitting stack 22 including a first conductivity type semiconductor layer 224, a light-emitting layer 222 and a second conductivity type semiconductor layer 220 sequentially formed on the first surface 201 of the substrate 20 wherein the upper surface 2201 of the second conductivity type semiconductor layer 220 has a textured surface formed by an epitaxy method, an etching method, or the combination thereof. The light emitting stack 22 is etched, and part of the first semiconductor layer 224 is exposed to form a horizontal type light emitting device.

The material of the light emitting stack 22 contains one or more elements selected from the group consisting of Ga, Al, In, As, P, N and Si, such as aluminum gallium indium phosphide (AlGaInP) series material, aluminum gallium indium nitride (AlGaInN) series material and so on. The light-emitting layer 222 can be a single heterostructure (SH), a double heterostructure (DH), a double-side double heterostructure (DDH), or a multi-quantum well (MWQ). Besides, the wavelength of the emitting light can also be adjusted by changing the number of the pairs of the quantum well.

Following a similar process as the first embodiment, a first planarization layer (not shown) is formed by spin coating method such as spin-on glass (SOG) or benzocyclobutene (BCB) to cover and fill the textured spaces of the upper surface 2201 of the second conductivity type semiconductor layer 220. The first planarization layer 23 can be formed by spin coating method such as spin-on glass (SOG) or benzocyclobutene (BCB). In one embodiment of this application, the SOG can be a dielectric material mixture of $SiO_2$ and dopants (either boron or phosphorous) that is suspended in a solvent solution. The SOG can also be polymers such as HSQ (Hydrogen silesquioxane) or MSQ (Methylsequioxane).

Then, the first planarization layer (not shown) is patterned and solidified to form a second planarization layer 231 by etching or lithography method wherein part of the upper surface 2201 of the second conductivity type semiconductor layer 220 is exposed and not covered by the second planarization layer 231. The position of the second planarization layer 231 is not specified and can be formed in the middle or the edge of the second conductivity type semiconductor layer 220.

Following, a first transparent conductive oxide layer 24 is formed to cover the entire second planarization layer 231 and part of the upper surface second conductivity type semiconductor layer 2201. The first transparent conductive oxide layer 24 includes a first portion 241 and a second portion 242, wherein the first portion 241 is formed in contact with the entire second planarization layer 231 which is substantially flat, and the second portion 242 is formed on the upper surface of the second conductivity type semiconductor layer 2201 having a first plurality of cavities 2421 in contact with the upper surface of the second conductivity type semiconductor layer 2201 and a second plurality of cavities 2422 formed in the upper surface of the second portion 242 which is opposite to the first plurality of cavities 2421. The first plurality of cavities 2421 are shaped into cones or pyramids and formed by an epitaxy method, an etching method, or the combination thereof. The second plurality of cavities 2422 are shaped into a cone or a pyramid by an etching process and extended downwards to the first plurality of cavities 2421 of the first transparent conductive layer 24, wherein the direction of the extension is preferably perpendicular to the top surface of the substrate 20.

Finally, a first electrode 25 is formed on the first portion 241 of the first transparent conductive oxide layer 24; and a second electrode 26 is formed on the exposed first semiconductor layer 224. The material of the electrode structure mentioned above can be metal material such as Cr, Ti, Ni, Pt, Cu, Au, Al, Ag, or the alloy thereof By the combination of the flat and textured first transparent oxide layer, the lower efficiency issues are solved.

Figure 2B:
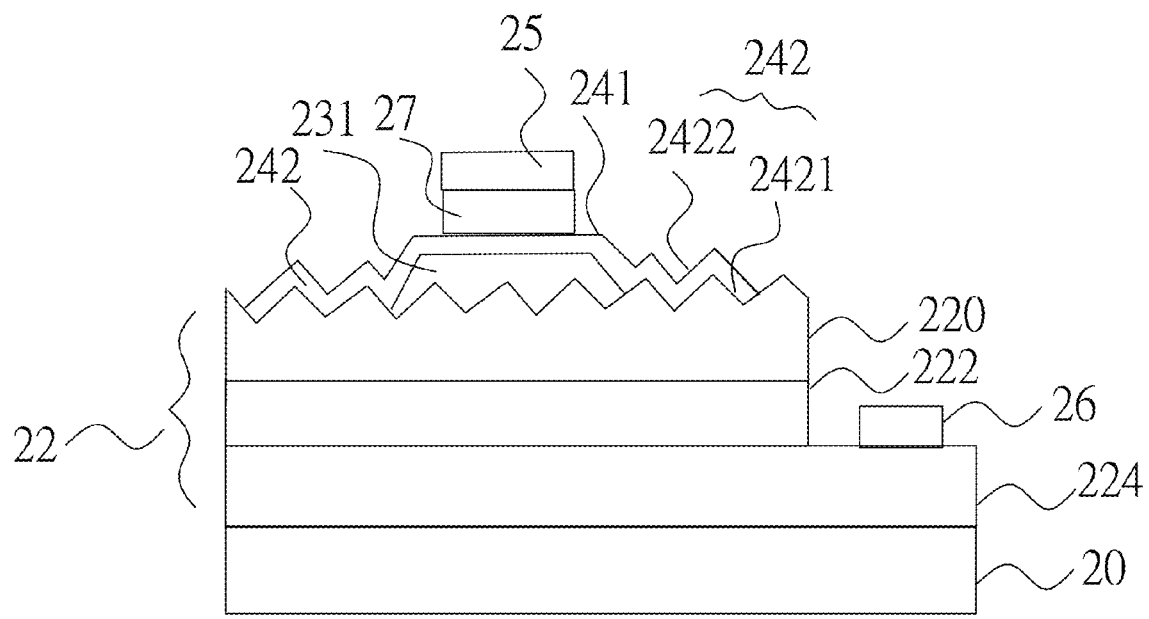

Referring to FIG. 2B, In another embodiment of this application, a first reflective metal layer 27 can be formed on the first portion 241 of the first transparent conductive oxide layer 24; a first electrode 25 can be formed on the first reflective metal layer 27 to improve the light-emitting efficiency.

The first plurality of cavities 2421 are extended downwards from the surface of the second semiconductor layer 220 and make the upper surface of the second portion 242 of the first transparent conductive oxide layer 24 conformally formed on the second semiconductor layer 220 and have the second plurality of cavities 2422. The adhesion strength between the first reflective metal layer 27 and the first transparent conductive oxide layer 24 has been improved by the first plurality of cavities 2421. The result of a peeling test for the device made in accordance with the first embodiment and the conventional LED device without cavities on the surface of the first transparent oxide layer shows that all the devices in accordance with the first embodiment passed the peeling test, but more than 80% of the conventional LED devices failed in the peeling test. By the combination of the flat and textured first transparent oxide layer, the lower efficiency and peeling issues are solved.

Figure 2C:
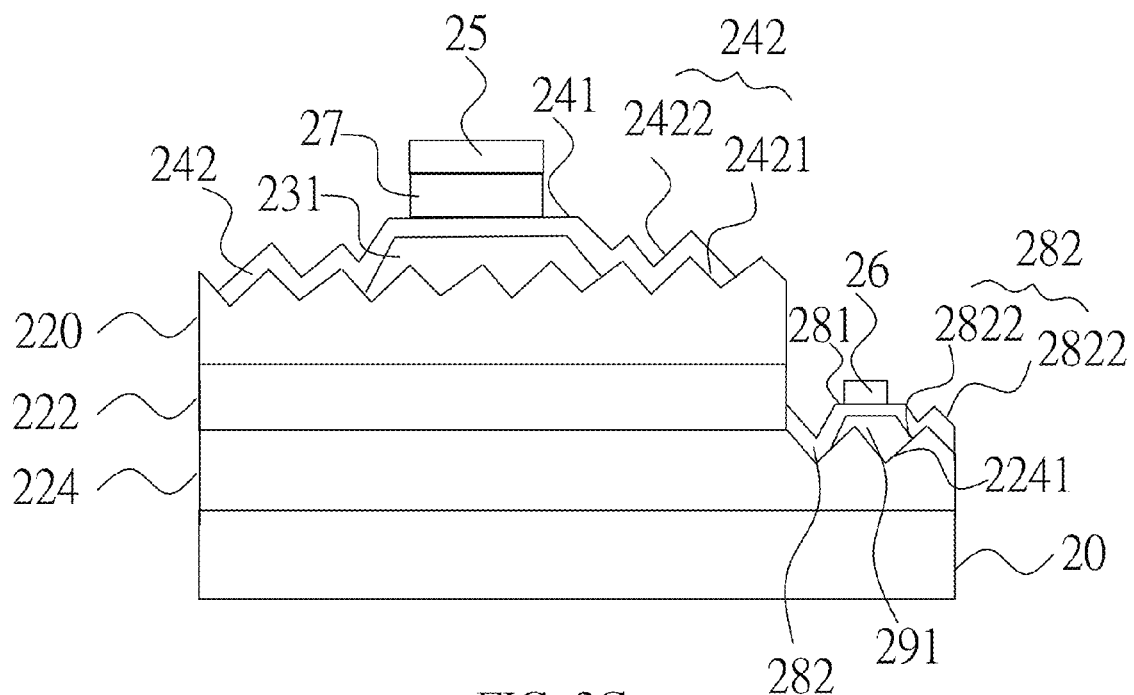

Referring to FIG. 2C, in another embodiment of this application, the difference between the FIG. 2A and FIG. 2C is that the first semiconductor layer 224 is etched to form a textured surface 2241. Following, a similar process as the embodiment in FIG. 2A, a third planarization layer (not shown) is formed by spin coating method such as spin-on glass (SOG) or benzocyclobutene (BCB) to cover and fill the textured spaces of the upper surface 2241 of the first conductivity type semiconductor layer 220 and then the third planarization layer (not shown) is patterned and solidified to form a fourth planarization layer 291 by etching or lithography method wherein part of the upper surface 2241 of the first conductivity type semiconductor layer 224 is exposed. The position of the fourth planarization layer 291 is not specified and can be formed in the middle or the edge of the second conductivity type semiconductor layer 224.

Following, a second transparent conductive oxide layer 28 is formed to cover the entire fourth planarization layer 291 and part of the upper surface first conductivity type semiconductor layer 2241. The second transparent conductive oxide layer 28 includes a first portion 281 and a second portion 282 wherein the first portion 281 is formed in contact with the entire fourth planarization layer 291 which is substantially flat and the second portion 282 is formed on the upper surface of the first conductivity type semiconductor layer 2241 having a first plurality of cavities 2821 in contact with the upper surface of the first conductivity type semiconductor layer 2241 and a second plurality of cavities 2822 formed in the upper surface of the second portion 282 which is opposite to the first plurality of cavities 2821. The first plurality of cavities 2821 are shaped into cones or pyramids and formed by an epitaxy method, an etching method, or the combination thereof. The second plurality of cavities 2822 are shaped into a cone or a pyramid by an etching process and extended downwards to the first plurality of cavities 2821 of the second transparent conductive layer 28, wherein the direction of the extension is preferably perpendicular to the top surface of the substrate 20.

Finally, a first electrode 25 is formed on the first portion 241 of the first transparent conductive oxide layer 24; and a second electrode 26 is formed on the first portion 281 of the second transparent conductive oxide layer 28. The material of the electrode structure mentioned above can be metal material such as Cr, Ti, Ni, Pt, Cu, Au, Al, or Ag. By the combination of the flat and textured first transparent oxide layer and the flat and textured second transparent oxide layer, the lower efficiency issues are solved.

Figure 2D:
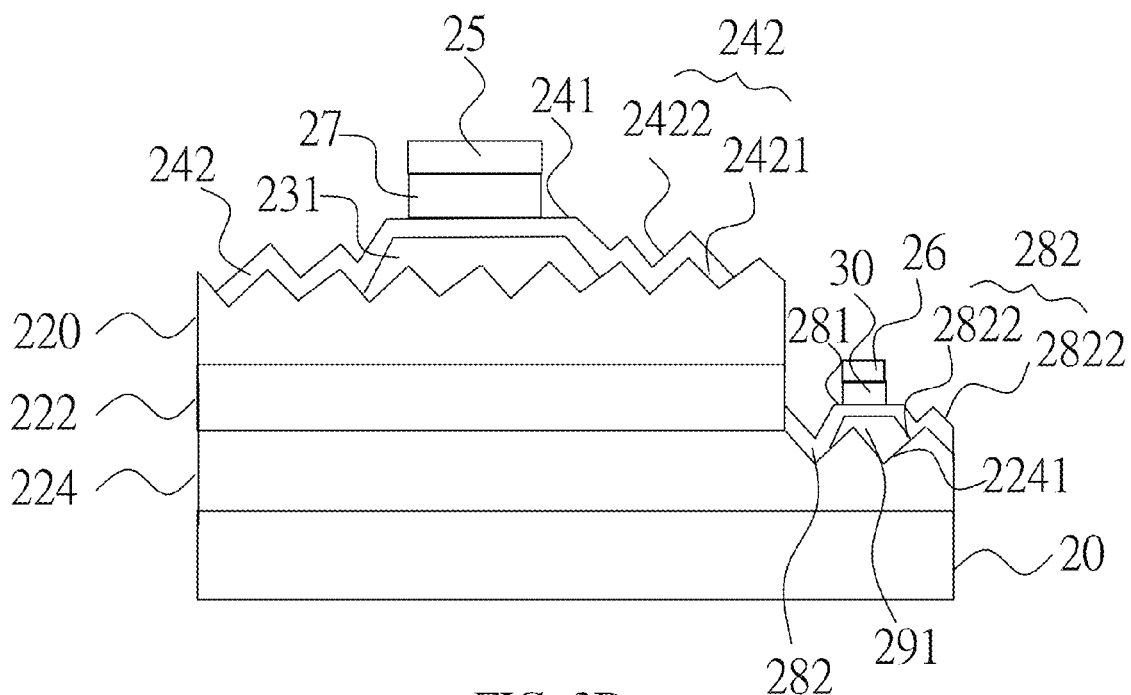

Referring to FIG. 2D, in another embodiment of this application, a second reflective metal layer 30 can be formed on the first portion 281 of the second transparent conductive oxide layer 28; a first electrode 25 can be formed on the first reflective metal layer 27 and a second electrode 26 can be formed on the second reflective layer 30 to improve the light-emitting efficiency.

Figure 3:
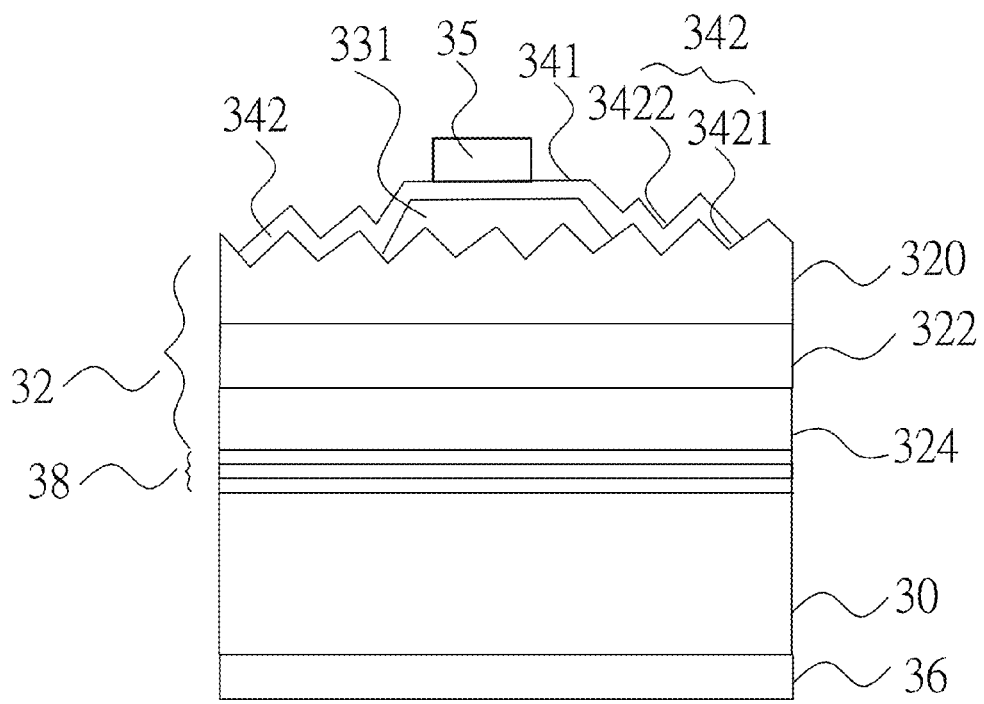
FIG. 3 is a cross-sectional view of a light-emitting device in accordance with a third embodiment of the present application.

FIG. 3 is a cross-sectional view of a light-emitting device in accordance with a third embodiment of the present application. The difference between the third embodiment and the first embodiment is that an additional Distributed Bragg Reflector (DBR) layer 38 is formed between the conductive substrate 30 and the first semiconductor layer 324.

Figure 4:
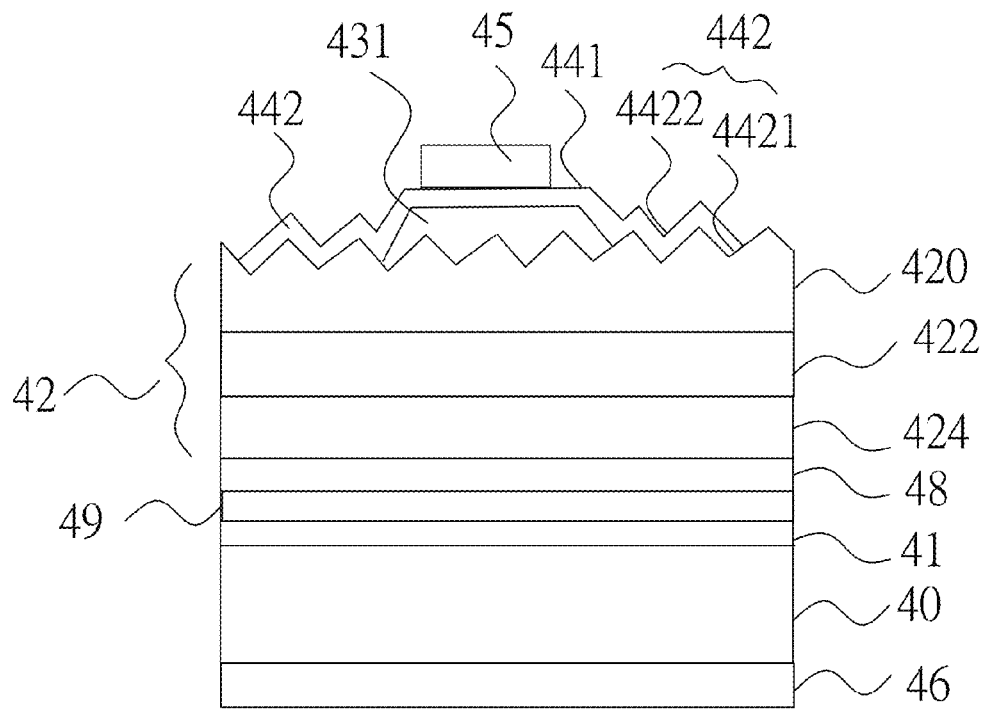
FIG. 4 is a cross-sectional view of a light-emitting device in accordance with a fourth embodiment of the present application.

FIG. 4 is a cross-sectional view of a light-emitting device in accordance with a fourth embodiment of the application. The difference between the fourth embodiment and the first embodiment is that a metal bonding layer 41, a reflective layer 49 and a second transparent conductive oxide layer 48 is formed between the conductive substrate 40 and the first semiconductor layer 424.

Figure 5:
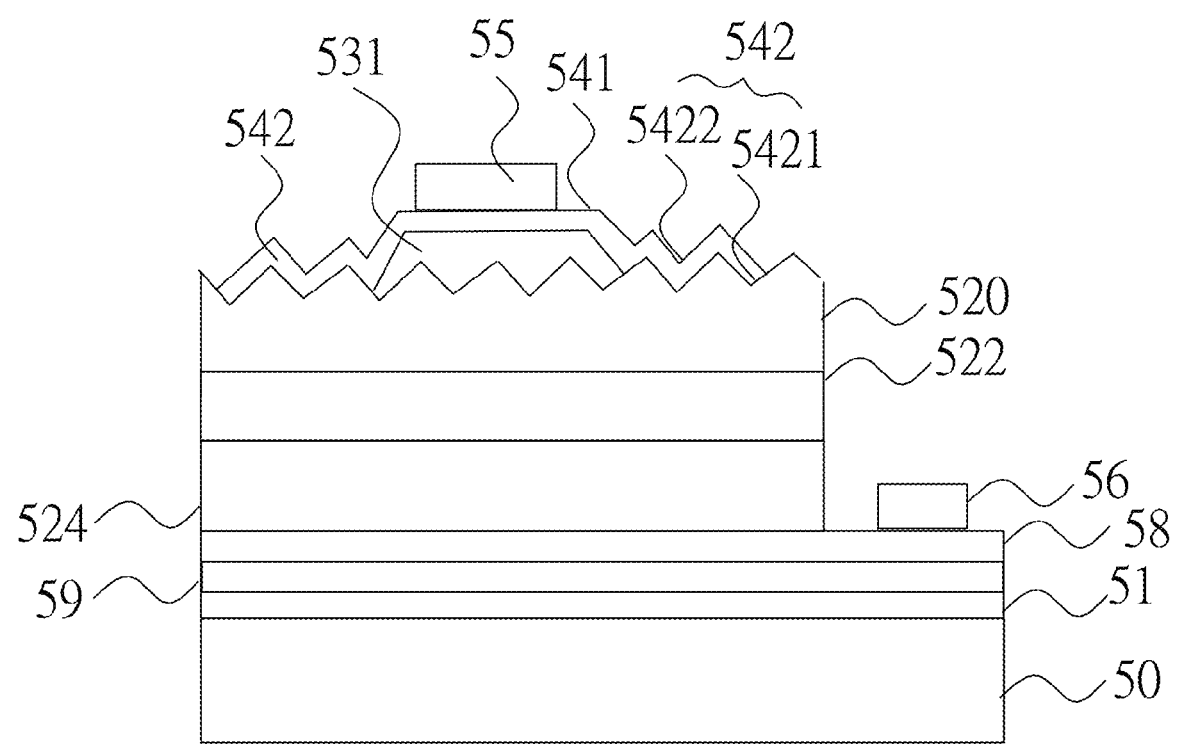
FIG. 5 is a cross-sectional view of a light-emitting device in accordance with a fifth embodiment of the present application.

FIG. 5 is a cross-sectional view of a light-emitting device in accordance with a fifth embodiment of the present application. The difference between the fourth embodiment and the second embodiment is that a metal bonding layer 51, a reflective layer 59 and a second transparent conductive oxide layer 58 is formed between the substrate 50 and the first semiconductor layer 524 and the second electrode 56 is formed on the second transparent conductive oxide layer 58.

Figure 6A:
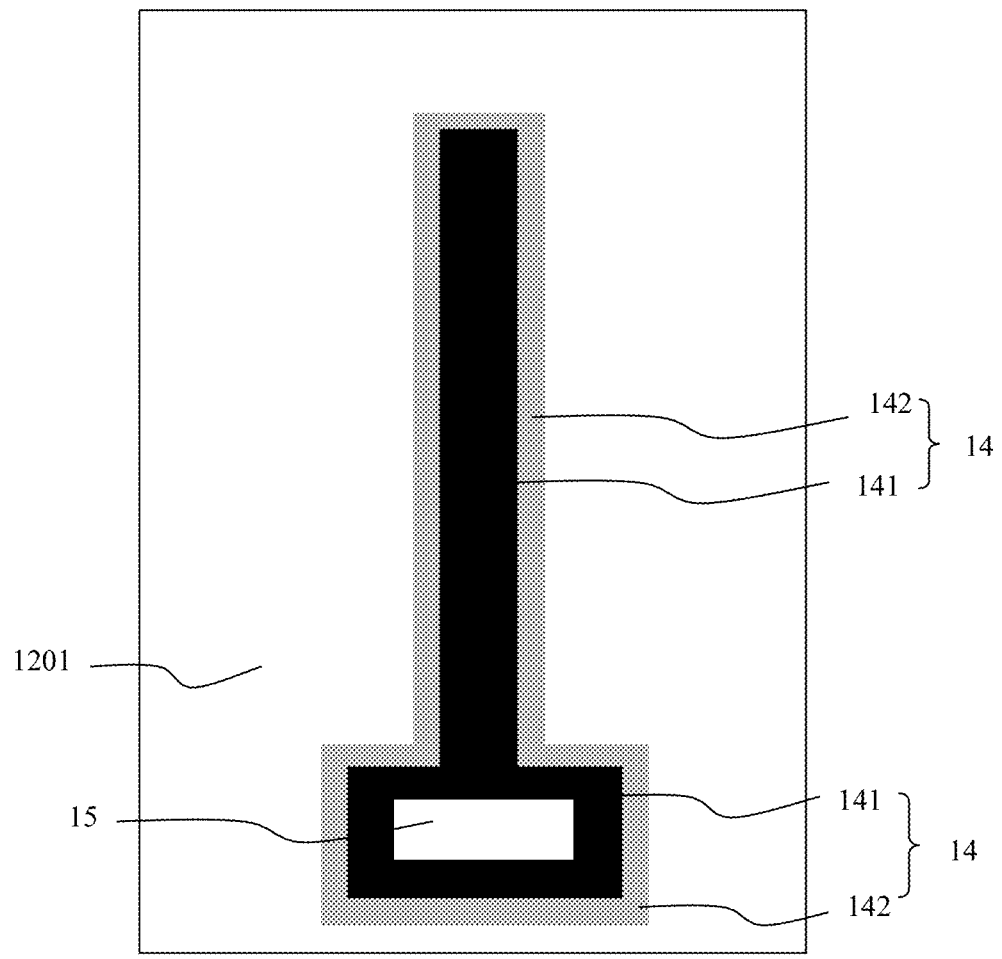
FIGS. 6A-6B are top views of a second semiconductor layer in accordance with a first embodiment of the present application.
Figure 6B:
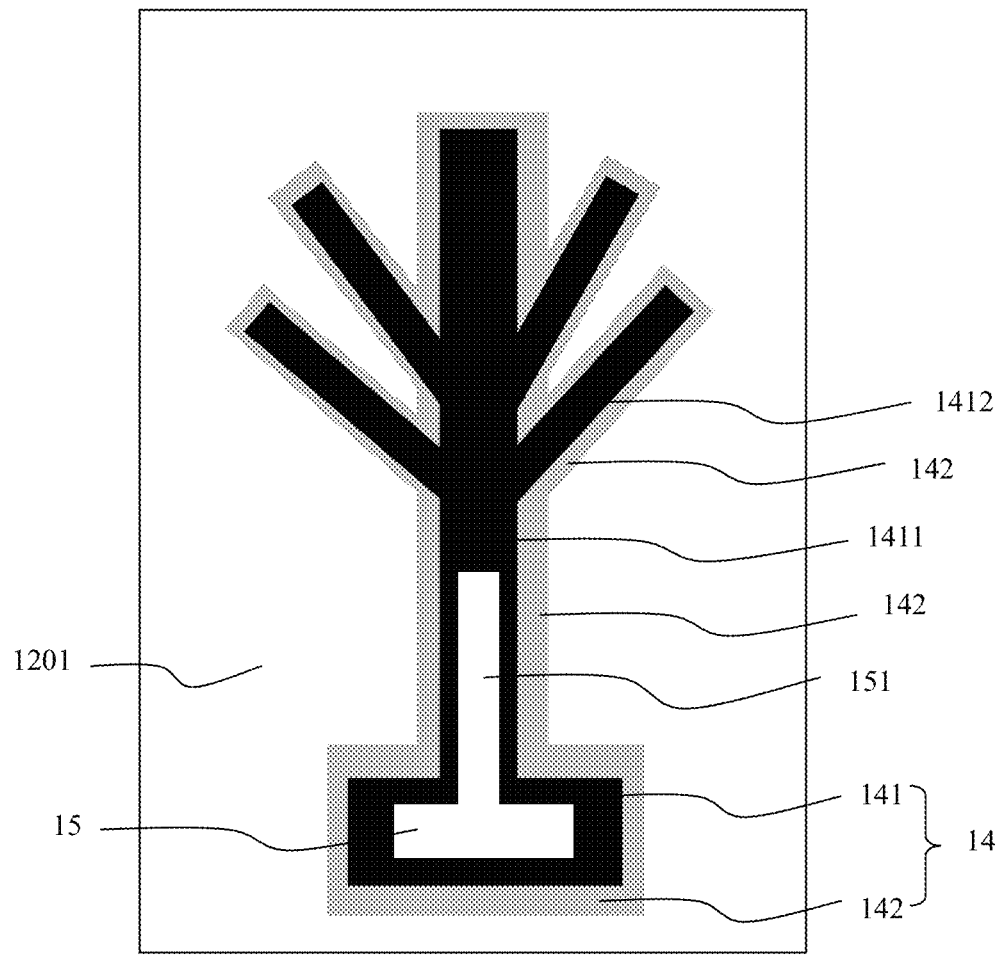

FIGS. 6A-6B are top views of a second semiconductor layer in accordance with a first embodiment of the present application. FIG. 6A is a top view of a second semiconductor layer 120, the second planarization layer (not shown) can be formed on part of the second semiconductor layer 120. After forming the second planarization layer, the first transparent conductive oxide layer 14 is formed on part of the second planarization layer and having a first portion 141 in contact with the entire second planarization layer which is substantially flat and a second portion formed on the second semiconductor layer 120 with a textured surface. Following, a first electrode 15 is formed on the first portion 141 of the first transparent conductive oxide layer 14. In this embodiment, part of the first transparent conductive oxide layer 14 is not covered by the first electrode 15 and is extended toward the other end of the light emitting chip as a finger to spread the current.

Referring to FIG. 6B, in another embodiment, the first electrode 15 can have a secondary branch 151 having a finger-like pattern extended toward the other end of the light emitting device to have better current spreading. The first transparent conductive oxide layer 14 can further have a secondary branch 1411 having a finger-like pattern extended toward the other end of the light emitting device and a third class branch 1412 extended from the secondary branch 1411 as a transparent finger to increase the current spreading efficiency. In this embodiment, part of the secondary branch 1411 and the third class branch 1412 of the first transparent conductive oxide layer is not covered by the secondary branch of the first electrode 151. Since the secondary branch of the first transparent conductive oxide layer 1411 and the third class branch 1412 of the first transparent conductive oxide layer is formed on the second planarization layer (not shown), the structure is also substantially flat and can have a better current spreading efficiency.

Figure 7A:
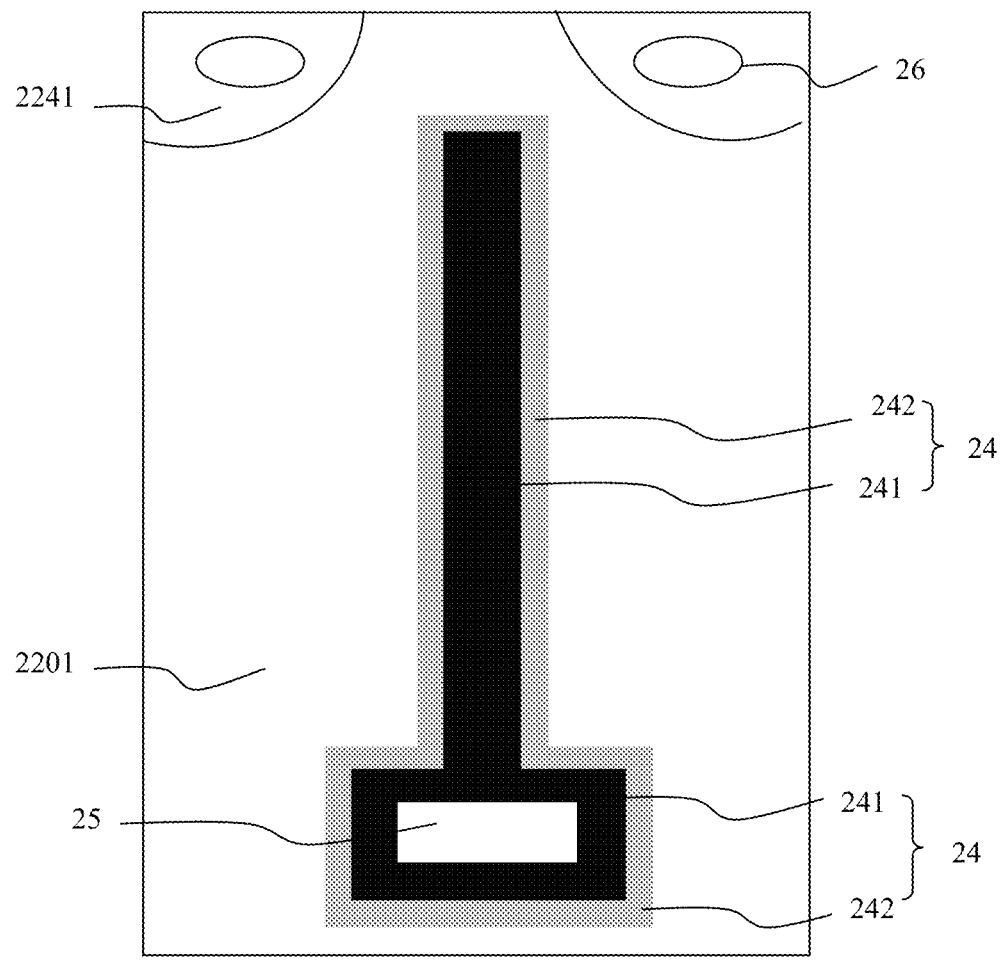
FIGS. 7A-7B are top views second semiconductor layer in accordance with a second embodiment of the present application.
Figure 7B:
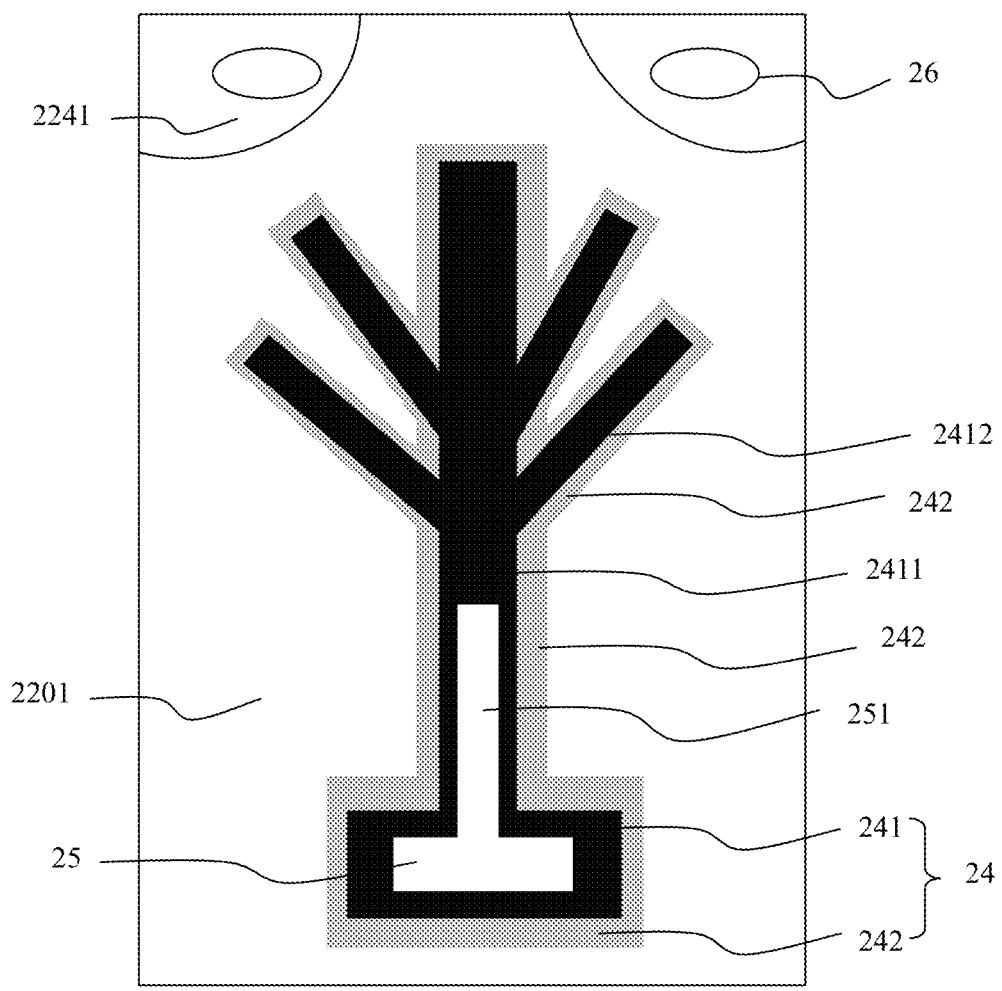

FIGS. 7A-7B are top views of a second semiconductor layer in accordance with a first embodiment of the present application. FIG. 7A is a top view of a second semiconductor layer 220, the second planarization layer (not shown) can be formed on part of the second semiconductor layer 220. After forming the second planarization layer, the first transparent conductive oxide layer 24 is formed on part of the second planarization layer and having a first portion 241 in contact with the entire second planarization layer which is substantially flat and a second portion formed on the second semiconductor layer 220 with a textured surface. Following, a first electrode 25 is formed on the first portion 241 of the first transparent conductive oxide layer 24. In this embodiment, part of the first transparent conductive oxide layer 24 is not covered by the first electrode 25 and is extended toward the other end of the light emitting chip as a finger to spread the current.

Referring to FIG. 7B, in another embodiment, the first electrode 25 can have a secondary branch 251 having a finger-like pattern extended toward the other end of the light emitting device to have better current spreading. The first transparent conductive oxide layer 24 can further have a secondary branch 2411 having a finger-like pattern extended toward the other end of the light emitting device and a third class branch 2412 extended from the secondary branch 2411 as a transparent finger to increase the current spreading efficiency. In this embodiment, part of the secondary branch 2411 and the third class branch 2412 of the first transparent conductive oxide layer is not covered by the secondary branch of the first electrode 251. Since the secondary branch of the first transparent conductive oxide layer 2411 and the third class branch 2412 of the first transparent conductive oxide layer is formed on the second planarization layer (not shown), the structure is also substantially flat and can have a better current spreading efficiency.

In the aforementioned embodiments, the conductive substrates 10, 30 and 40 are made of SiC, GaAs, GaN, AlN, GaP, Si, or the combination thereof, and the substrates 20 and 50 are made of sapphire, glass, or the combination thereof.

In the aforementioned embodiments, the first transparent conductive oxide layer 14 and 24, the second transparent conductive oxide layer 28 is made of indium tin oxide (ITO), cadmium tin oxide (CTO), antimony tin oxide, zinc indium oxide, aluminum zinc oxide, zinc antimony oxide, or the combinations thereof; and is formed by an E-beam evaporation method, an ion-sputtering method, a thermal-evaporation method, or any combination thereof. Taking ITO as an example, the thickness of the first transparent conductive oxide layer 14 and 24, the second transparent conductive oxide layer 28 is from 50 μm to 1 μm and the transmissivity is above 50% when the range of the related wavelength is from 300 μm to 700 μm.

In the aforementioned embodiments, the metal bonding layer 41, 51 is made of indium (In), tin (Sn), gold-tin (AuSn), or the combination thereof The DBR layer 38 is formed by stacked semiconductor layers and the reflective layers 49, 59 are made of In, Sn, Ai, Au, Pt, Zn, Ag, Ti, Pb, Pd, Ge, Cu, AuBe, AuGe, Ni, PbSn, AuZn, or the combination thereof. The first and second reflective metal layers 17, 27 and 30 are made of Al or Ag.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present application has been explained above, it is not the limitation of the range, the sequence in practice, the material in practice, or the method in practice. Any modification or decoration for present application is not detached from the spirit and the range of such.

What is claimed is:

1. A light-emitting device comprising:
    a light-emitting stacked layer having a first conductivity type semiconductor layer; a light-emitting layer formed on the first conductivity type semiconductor layer; and a second conductivity type semiconductor layer formed on the light-emitting layer, wherein the upper surface of the second conductivity type semiconductor layer is a textured surface;
    a planarization layer formed on a first part of the second conductivity type semiconductor layer;
    a transparent conductive oxide layer formed on the planarization layer and a second part of the second conductivity type semiconductor layer, including a first portion on the planarization layer and a second portion having a first plurality of cavities on the second conductivity type semiconductor layer;
    an electrode formed on the first portion of the transparent conductive oxide layer; and
    a reflective metal layer formed between the transparent conductive oxide layer and the electrode.

2. The light-emitting device according to claim 1, further comprising a second plurality of cavities formed in the upper surface of the second portion of the transparent conductive oxide layer which is opposite to the first plurality of cavities.

3. The light-emitting device according to claim 1, wherein the material of the transparent conductive oxide layer is selected form the group consisting of indium tin oxide (ITO), cadmium tin oxide (CTO), antimony tin oxide, zinc indium oxide, aluminum zinc oxide, zinc antimony oxide, and the combinations thereof.

4. The light-emitting device according to claim 1, wherein the planarization layer is substantially flat and comprises spin-on glass (SOG) or benzocyclobutene (BCB).

5. The light-emitting device according to claim 4, wherein the SOG comprises a dielectric material.

6. The light-emitting device according to claim 1, wherein the material of the light-emitting stacked layer contains one or more elements selected from the group consisting of Ga, Al, In, As, P, N and Si.

7. The light-emitting device according to claim 1, wherein the transparent conductive oxide layer has a secondary branch, and the electrode covering a part of the transparent conductive oxide layer has a secondary branch extend toward the other end of the light emitting device.

8. The light-emitting device according to claim 7, wherein the transparent conductive oxide layer further has a third branch extended from the secondary branch and not covered by the electrode.

9. The light-emitting device according to claim 7, wherein the area of the planarization layer is larger than the area of the electrode and/or the secondary branch.

10. A light-emitting device comprising:
a light-emitting stacked layer having a first conductivity type semiconductor layer; a light-emitting layer formed on the first conductivity type semiconductor layer; and a second conductivity type semiconductor layer formed on the light-emitting layer, wherein the upper surface of the second conductivity type semiconductor layer is a textured surface;
an insulating layer formed on a first part of the second conductivity type semiconductor layer;
a transparent conductive oxide layer formed on the insulating layer and a second part of the second conductivity type semiconductor layer;
an electrode formed on the first portion of the transparent conductive oxide layer; and
a reflective layer formed between the electrode and the transparent conductive oxide layer.

11. The light-emitting device according to claim 10, wherein the material of the transparent conductive oxide layer is selected form the group consisting of indium tin oxide (ITO), cadmium tin oxide (CTO), antimony tin oxide, zinc indium oxide, aluminum zinc oxide, zinc antimony oxide, and the combinations thereof.

12. The light-emitting device according to claim 10, wherein the insulating layer is substantially flat and comprises spin-on glass (SOG) or benzocyclobutene (BCB) and/or the SOG comprises a dielectric material.

13. The light-emitting device according to claim 10, wherein the material of the light-emitting stacked layer contains one or more elements selected from the group consisting of Ga, Al, In, As, P, N and Si.

14. The light-emitting device according to claim 10, wherein the transparent conductive oxide layer has a secondary branch, and the electrode covering a part of the transparent conductive oxide layer has a secondary branch extend toward the other end of the light emitting device.

15. The light-emitting device according to claim 10, wherein the electrode has a secondary branch, and covering a part of the transparent conductive oxide layer.

16. The light-emitting device according to claim 10, wherein the area of the insulating layer is larger than the area of the electrode and/or the secondary branch.

17. The light-emitting device according to claim 1, further comprising a substrate formed below the light-emitting stacked layer and/or further comprising a substrate formed below the light-emitting stacked layer and a bonding layer formed between the light-emitting stacked layer and the substrate.

18. A light-emitting device comprising:
a light-emitting stacked layer having a first conductivity type semiconductor layer; a light-emitting layer formed on the first conductivity type semiconductor layer; and a second conductivity type semiconductor layer formed on the light-emitting layer, wherein the upper surface of the second conductivity type semiconductor layer is a textured surface;
a first planarization layer formed on a first part of the second conductivity type semiconductor layer;
a first transparent conductive oxide layer formed on the first planarization layer and a second part of the second conductivity type semiconductor layer, including a first portion in contact with the first planarization layer and a second portion having a first plurality of cavities in contact with the second conductivity type semiconductor layer;
a first electrode formed on the first portion of the first transparent conductive oxide layer; and
a second planarization layer formed on a first part of the upper surface of the first conductivity type semiconductor layer and a second transparent conductive oxide layer formed on the second planarization layer and a second part of the first conductivity type semiconductor layer, the second transparent conductive oxide layer including a first portion in contact with the second planarization layer and a second portion having a third plurality of cavities in contact with the first conductivity type semiconductor layer.

19. The light-emitting device according to claim 18, wherein the second planarization layer is substantially flat and comprises spin-on glass (SOG) or benzocyclobutene (BCB).

20. The light-emitting device according to claim 19, further comprising a fourth plurality of cavities formed in the upper surface of the second portion of the second transparent conductive oxide layer which is opposite to the third plurality of cavities.

* * * * *